United States Patent
Kijima

(10) Patent No.: US 8,072,307 B2
(45) Date of Patent: Dec. 6, 2011

(54) TRANSFORMER

(75) Inventor: Shinya Kijima, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 12/938,016

(22) Filed: Nov. 2, 2010

(65) Prior Publication Data

US 2011/0128108 A1 Jun. 2, 2011

(30) Foreign Application Priority Data

Nov. 27, 2009 (JP) .................. 2009-269875

(51) Int. Cl.
*H01F 5/00* (2006.01)
*H01F 27/28* (2006.01)
*H01L 27/08* (2006.01)
(52) U.S. Cl. .................. 336/200; 336/232; 257/531
(58) Field of Classification Search .................. 336/200, 336/232; 257/531
See application file for complete search history.

(56) References Cited

U.S. PATENT DOCUMENTS

| | | | |
|---|---|---|---|
| 4,416,056 A * | 11/1983 | Takahashi | 29/603.24 |
| 5,572,179 A * | 11/1996 | Ito et al. | 336/200 |
| 7,091,813 B2 * | 8/2006 | Liang et al. | 336/200 |
| 2004/0056749 A1 * | 3/2004 | Kahlmann et al. | 336/200 |
| 2006/0118905 A1 * | 6/2006 | Himori et al. | 257/531 |
| 2008/0179963 A1 * | 7/2008 | Fouquet et al. | 307/104 |
| 2008/0266043 A1 * | 10/2008 | Giandalia et al. | 336/200 |
| 2009/0046489 A1 * | 2/2009 | Yoshimura et al. | 363/123 |
| 2009/0283854 A1 * | 11/2009 | Levy et al. | 257/531 |

FOREIGN PATENT DOCUMENTS

JP 7-183468 7/1995

* cited by examiner

*Primary Examiner* — Elvin G Enad
*Assistant Examiner* — Tsz Chan
(74) *Attorney, Agent, or Firm* — Kenyon & Kenyon LLP

(57) ABSTRACT

A transformer may include a semiconductor layer coil, a trench coil connected with the semiconductor layer coil in parallel, and a metal layer coil opposing both of the semiconductor layer coil and the trench coil. The semiconductor layer coil and the trench coil may be insulated from the metal layer coil by an insulating layer.

9 Claims, 5 Drawing Sheets

US 8,072,307 B2

TRANSFORMER

CROSS-REFERENCE TO RELATED APPLICATION

This application claims priority to Japanese Patent Application No. 2009-269875 filed on Nov. 27, 2009, the contents of which are hereby incorporated by reference into the present application.

TECHNICAL FIELD

The present teachings relate to a transformer that performs signal transmission between electrically-insulated electrical circuits.

DESCRIPTION OF RELATED ART

There are methods of performing signal transmission between electrically-insulated electrical circuits so as to prevent an excessive current from flowing when a high voltage is suddenly applied such as during a surge. One such method utilizes inductive coupling by a transformer. Due to ongoing downsizing, transformers are now small enough to be integrated with integrated circuits. Hereinafter, such a small transformer shall be referred to as a microtransformer.

Conventionally, a microtransformer formed by laminating, on a silicon substrate surface, an insulating layer, a first coil composed of a metal layer, an insulating layer, a second coil composed of a metal layer, and an insulating layer in this order is used. In addition, Japanese Patent Application Publication No. H07-183468 discloses a microtransformer comprising a first coil composed of a spiral semiconductor layer formed on a semiconductor substrate, a second coil composed of a metal layer, and an insulating layer that separates the first coil from the second coil.

SUMMARY

When a semiconductor layer formed on a semiconductor substrate is used as a first coil as in the case of Japanese Patent Application Publication No. H07-183468, an insulating layer conventionally formed between a silicon substrate and the first coil can be eliminated, and the microtransformer can be downsized thereby. On the other hand, a semiconductor layer has a higher series resistance than a metal layer. Therefore, simply replacing the first coil composed of a metal layer with the first coil composed of the semiconductor layer results in deterioration of a gain or a tolerable coupling noise characteristic of the microtransformer.

An object of the present teachings is to provide a transformer capable of achieving both downsizing and property retention of a microtransformer.

A transformer according to one aspect of the present teachings comprises: a semiconductor substrate comprising a first conductivity type semiconductor layer; a semiconductor layer coil comprising a semiconductor layer coil wiring composed of a second conductivity type semiconductor layer laminated on a surface side of the first conductivity type semiconductor layer; a trench coil connected with the semiconductor layer coil in parallel; a coil insulating layer laminated on the surface side of the first conductivity type semiconductor layer, covering over both of the semiconductor layer coil and the trench coil; and a metal layer coil arranged on a surface of the coil insulating layer. A trench is formed in the first conductivity type semiconductor layer, each of the semiconductor layer coil wiring and the trench has a spiral shape, the trench and the semiconductor layer coil wiring are alternately disposed in the radial direction thereof, the trench coil comprises (a) a trench insulating film arranged on an inner surface of the trench, and (b) a trench coil wiring composed of a conductive layer disposed within the trench and covered by the trench insulating film, and the metal layer coil opposes both of the semiconductor layer coil and the trench coil.

With this transformer, a first coil is constituted by the semiconductor layer coil and the trench coil connected with each other in parallel on the surface of the first conductivity type semiconductor layer and a second coil is constituted by the metal layer coil. Since the semiconductor layer coil of the first coil uses the semiconductor layer as the coil wiring, an insulating layer between the first conductivity type semiconductor layer and the first coil can be eliminated and the microtransformer can be downsized. In addition, since the trench coil and the semiconductor layer coil are connected with each other in parallel, a resistance of the first coil can be reduced. Further, the semiconductor layer coil wiring and the trench coil wiring respectively have spiral shapes and are alternately disposed in the radial direction thereof. As a result, properties of the microtransformer such as gain and tolerable coupling noise can be retained.

The transformer preferably further comprises a metallic compound layer arranged between the semiconductor layer coil and the coil insulating layer, and the metallic compound layer preferably makes contact with the semiconductor layer coil. The metallic compound layer is preferably composed of a silicide layer.

A method for manufacturing the transformer described above preferably includes the steps of forming the trench coil in the first conductivity type semiconductor layer; and forming the semiconductor layer coil by performing ion injection to the first conductivity type semiconductor layer between trench coil wiring of the trench coil formed in the previous step. According to such a manufacturing method, a semiconductor layer coil can be accurately formed.

DETAILED DESCRIPTION OF EMBODIMENT

Hereinafter, a first embodiment of the present teachings will be described with reference to the drawings. In the embodiment, a transformer whose first conductivity type is the p-type and whose second conductivity type is the n-type will be exemplified and described.

Figure 1:
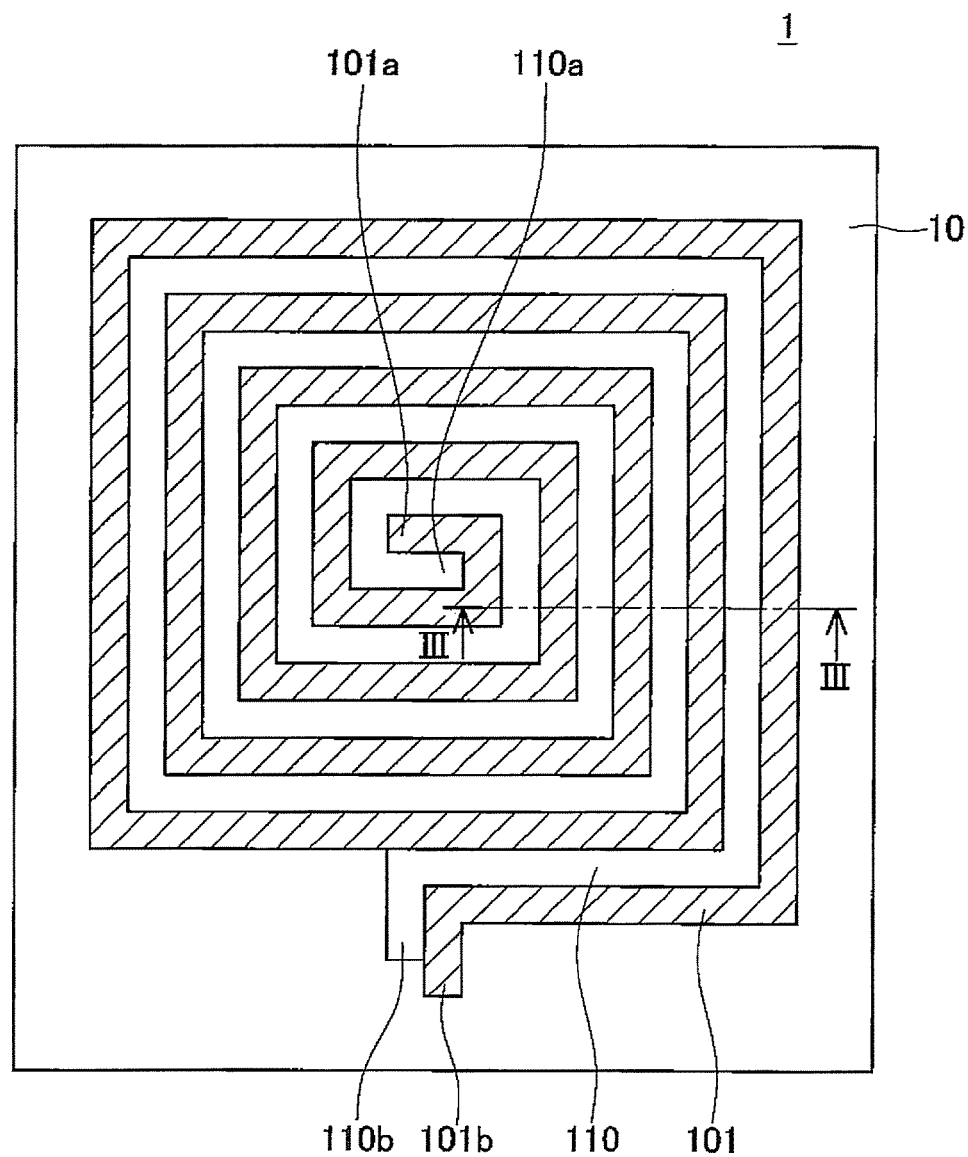
FIG. 1 is a plan view of a first coil of a microtransformer according to an embodiment.
Figure 2:
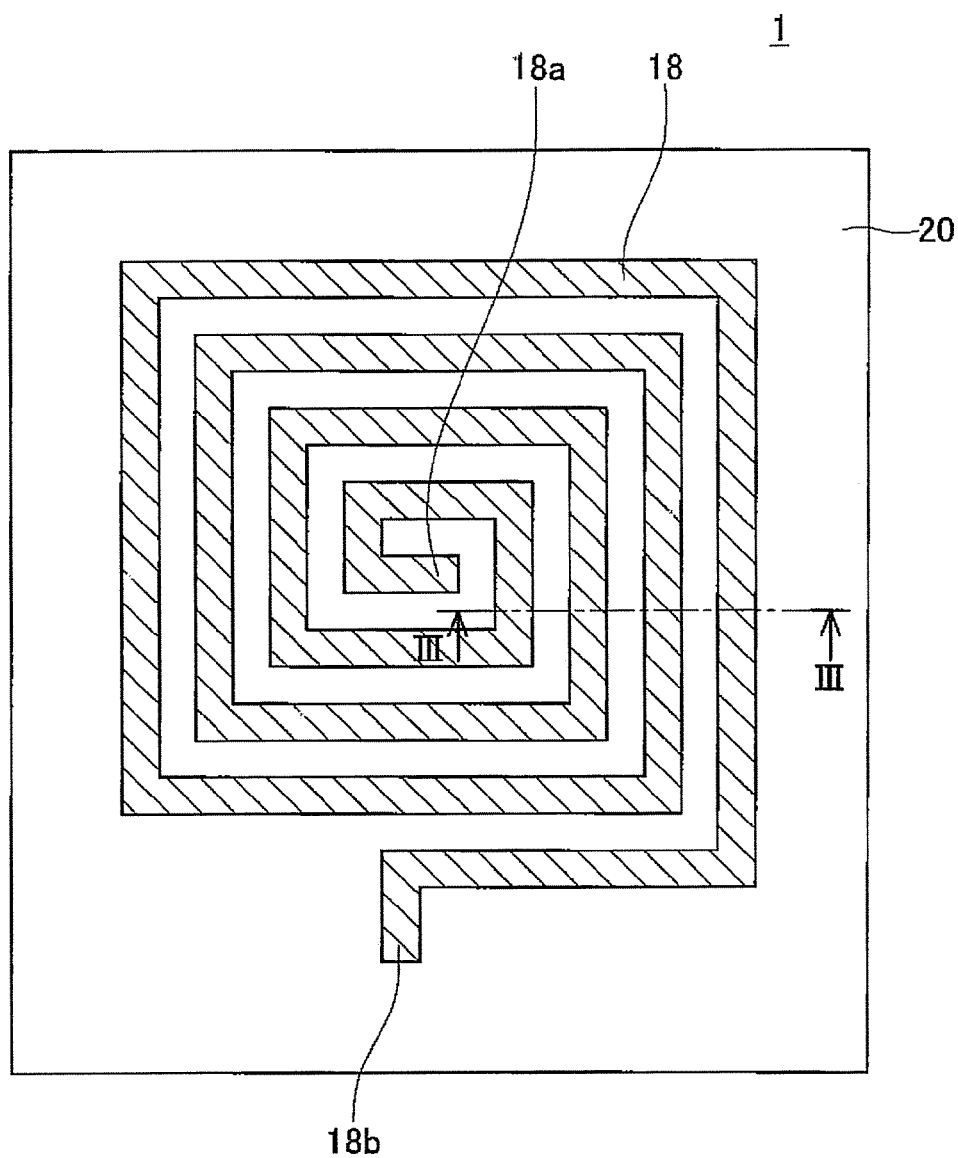
FIG. 2 is a plan view of a second coil of the microtransformer according to the embodiment.
Figure 3:
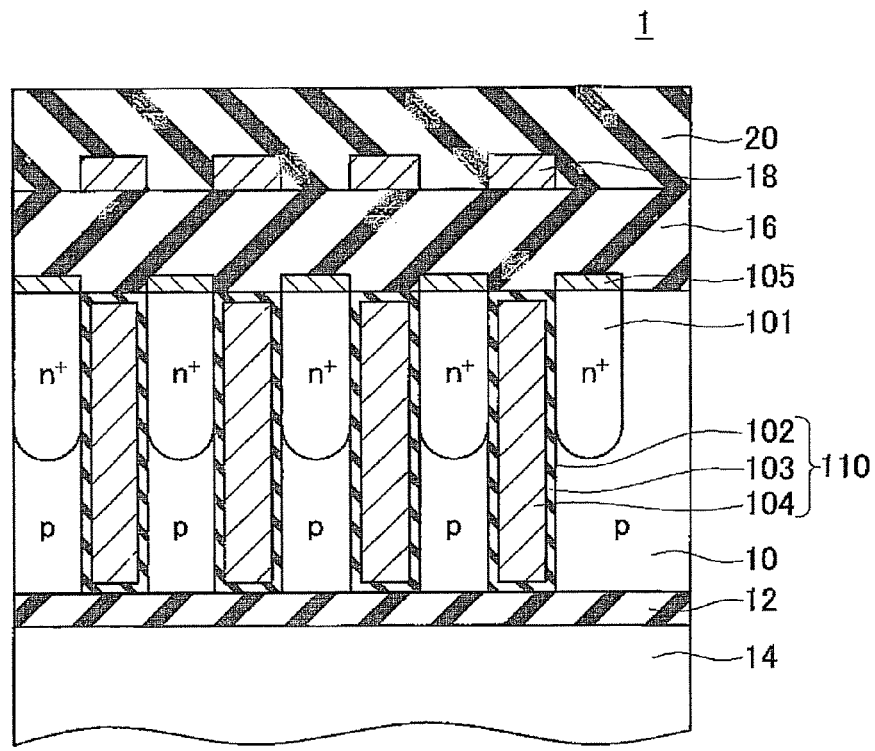
FIG. 3 is a cross-sectional view taken along line III-III of FIGS. 1 and 2.
Figure 4:
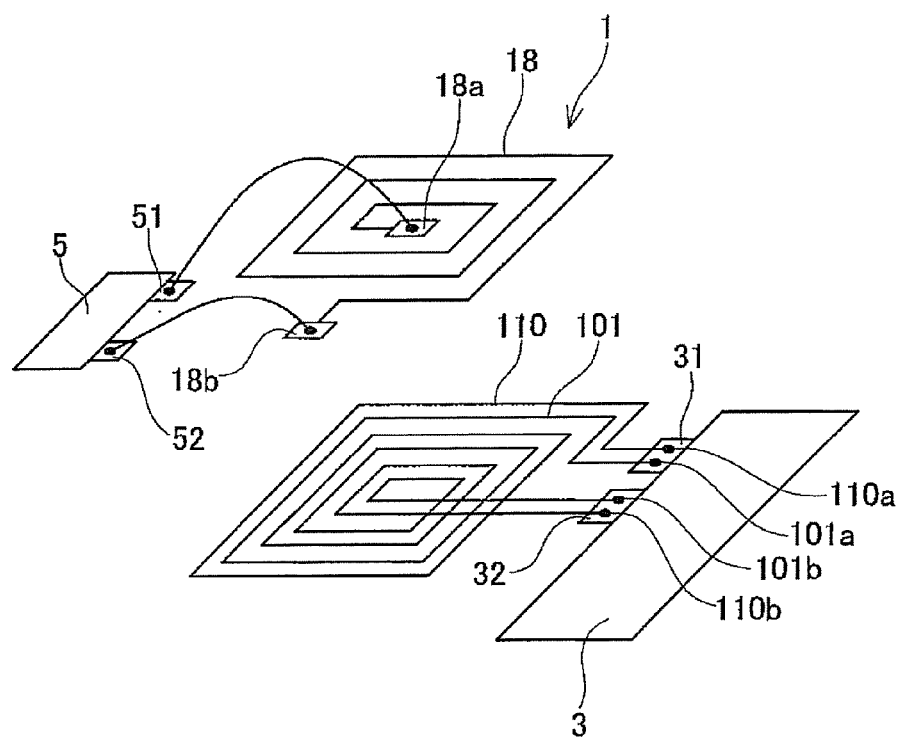
FIG. 4 is a transmitter/receiver comprising the microtransformer according to the embodiment.

FIGS. 1 and 2 are diagrams illustrating a microtransformer according to the embodiment. FIG. 1 illustrates a plan view of a microtransformer 1 sectioned along a plane including the first coil, and FIG. 2 illustrates a plan view of the microtransformer 1 sectioned along a plane including the second coil. FIG. 3 is a cross-sectional view of the microtransformer 1 illustrated in FIGS. 1 and 2 taken along line III-III. FIG. 4 is a conceptual diagram illustrating a transmitter/receiver comprising the microtransformer 1, a transmitter circuit 3, and a receiver circuit 5.

As illustrated in FIGS. 1 to 3, the microtransformer 1 comprises a lower substrate 14, an insulating layer 12 making contact with a surface of the lower substrate 14, and a p-type semiconductor layer 10. In the present embodiment, an SOI (Silicon On Insulator) substrate in which an insulating layer is inserted between a silicon substrate and a surface silicon layer is used as a semiconductor substrate comprising the lower substrate 14, the insulating layer 12, and the semiconductor layer 10. The surface silicon layer (active layer) is used as the semiconductor layer 10, the silicon substrate (handle layer) is used as the lower substrate 14, and the insulating layer (box layer) is used as the insulating layer 12.

A semiconductor layer coil 101 and a trench coil 110 are formed on a surface side of the p-type semiconductor layer 10. The semiconductor layer coil 101 comprises a semiconductor layer coil wiring composed of an n-type semiconductor layer. The trench 102 is formed on the p-type semiconductor layer 10 between coil wirings of the semiconductor layer coil 101. The trench coil 110 comprises a trench insulating film 103 and a conductive layer 104 that functions as a trench coil wiring. The trench insulating film 103 is formed on an inner wall surface of the trench 102. The conductive layer 104 is disposed in the trench 102 and covered by the trench insulating film 103. The conductive layer 104 is separated from the p-type semiconductor layer 10 and the semiconductor layer coil 101 by the trench insulating film 103. The trench coil 110 penetrates the p-type semiconductor layer 10. An upper end of the trench coil 110 is in contact with a coil insulating layer 16 and a lower end of the trench coil 110 is in contact with the insulating layer 12.

A metallic compound layer 105 is provided so as to make contact with the surface of the semiconductor layer coil 101, and the surface of the metallic compound layer 105 is covered by the coil insulating layer 16. A metal layer coil 18 that is a metal layer is formed on a surface of the coil insulating layer 16, and the surface of the metal layer coil 18 is covered by an insulating layer 20. The semiconductor layer coil 101 and the trench coil 110 are insulated from the metal layer coil 18 by the coil insulating layer 16 and are associated with each other. The metallic compound layer 105 is a silicide layer. Materials suitably used for the silicide layer include silicides such as titanium silicide (TiSix), cobalt silicide (CoSix), tungsten silicide (WSix), and molybdenum silicide (MoSix).

As illustrated in FIG. 1, the semiconductor layer coil wiring of the semiconductor layer coil 101 is formed in a spiral shape (planar spiral shape) on a surface side of the p-type semiconductor layer 10. The metallic compound layer 105 is similarly formed in a spiral shape on the surface of the semiconductor layer coil 101. In addition, the trench 102 is formed in a spiral shape in a region between the semiconductor layer coil 101 on the surface side of the p-type semiconductor layer 10. The trench insulating film 103 and the conductive layer 104 provided in the trench 102 are also formed in spiral shapes in the region between the semiconductor layer coil 101 on the surface side of the p-type semiconductor layer 10 in the same manner as the trench 102. In other words, the trench coil 110 is formed in a spiral shape in the region between the semiconductor layer coil 101 on the surface side of the p-type semiconductor layer 10.

As illustrated in FIGS. 1 and 4, an end 101a of the semiconductor layer coil 101 and an end 110a of the trench coil 110 are connected to a first terminal 31 of the transmitter circuit 3, and an end 101b of the semiconductor layer coil 101 and an end 110b of the trench coil 110 are connected to a second terminal 32 of the transmitter circuit 3. The semiconductor layer coil 101 and the trench coil 110 are connected in parallel between the first terminal 31 and the second terminal 32 of the transmitter circuit 3. In the present specification, the semiconductor layer coil 101 and the trench coil 110 will be collectively referred to as a first coil. In the present embodiment, the first coil is connected to the transmitter circuit 3.

As illustrated in FIGS. 2 and 3, the metal layer coil 18 is formed in a spiral shape on the surface of the coil insulating layer 16. The insulating layer 20 is provided between the metal layer coil 18. In the present embodiment, the metal layer coil 18 is formed at a position above the trench coil 110 and the insulating layer 20 is formed at a position above the semiconductor layer coil 101. As illustrated in FIGS. 2 and 4, an end 18a of the metal layer coil 18 is connected to a first terminal 51 of the receiver circuit 5 and an end 18b of the metal layer coil 18 is connected to a second terminal 52 of the receiver circuit 5. In the present specification, the metal layer coil 18 will be referred to as a second coil. In the present embodiment, the second coil is connected to the receiver circuit 5.

The transmitter circuit 3 comprises a power supply. When a voltage is applied between the first terminal 31 and the second terminal 32 of the transmitter circuit 3 by the power supply, currents flow in parallel between the end 101a and the end 101b of the semiconductor layer coil 101 and between the end 110a and the end 110b of the trench coil 110. In other words, a current flows through the first coil connected to the transmitter circuit 3.

When the current flows through the first coil (the semiconductor layer coil 101 and the trench coil 110) of the transmitter circuit 3, due to electromagnetic induction, a current flows between the ends 18a and 18b of the metal layer coil 18. Accordingly, the current flows through the second coil connected to the receiver circuit 5, and a signal inputted to the transmitter circuit 3 is transferred to the receiver circuit 5.

(Method for Manufacturing Microtransformer)

The microtransformer according to the present embodiment can be manufactured using a method generally adopted in a semiconductor process. Therefore, the complexity of a manufacturing process can be reduced. The semiconductor layer coil 101 can be formed e.g. by performing ion injection of an n-type dopant into the p-type semiconductor layer 10 and subsequently performing a thermal diffusion process. For example, the trench coil 110 can be formed by performing trench etching on the p-type semiconductor layer 10 to form the trench 102, and after forming the trench insulating film 103 by thermal oxidation or the like on the inner surface of the trench 102, filling the conductive layer 104. Materials usable for the conductive layer 104 include doped polysilicon and metallic materials such as tungsten.

Although the semiconductor layer coil 101 can be accurately formed by forming the trench coil 110 on the p-type semiconductor layer 10 and subsequently performing ion injection of an n-type dopant into the p-type semiconductor layer 10 between adjacent whorls of the trench coil 110, formation methods are not limited thereto. For example, the semiconductor layer coil 101 and the trench coil 110 can also be formed by forming an n-type semiconductor layer on an entire region where the semiconductor layer coil is formed on the p-type semiconductor layer 10 and subsequently forming trenches on the n-type semiconductor layer and the p-type semiconductor layer.

(Properties of Microtransformer)

Figure 5:
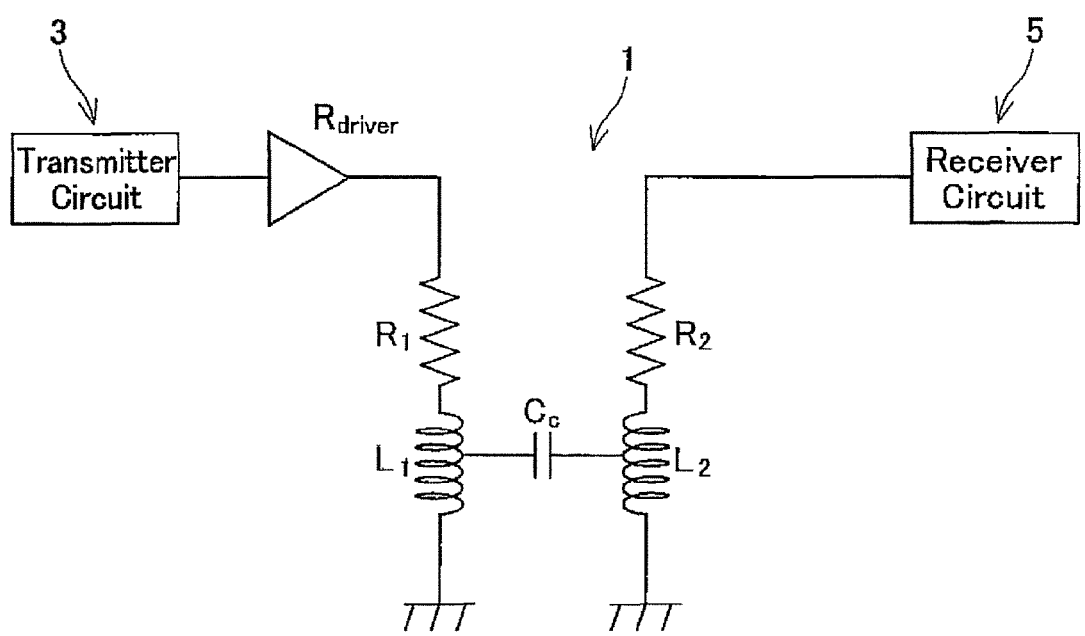
FIG. 5 is a circuit diagram of a transmitter circuit and a receiver circuit illustrated in FIG. 4.

Next, properties of the transformer will be described with reference to FIG. 5 that is a circuit diagram of a transmitter/ receiver comprising the microtransformer 1, the transmitter circuit 3, and the receiver circuit 5 illustrated in FIG. 4.

Important performance indicators of a transformer include gain and capacitive coupling noise, which are respectively expressed by equations (1) and (2) below.

$$\text{Gain} = \left| \frac{k\sqrt{L_2/L_1}}{\frac{R_{driver}+R_1}{j\omega L_1}+1} \right| \quad (1)$$

$$= \left| \frac{M}{\frac{R_{driver}+R_1}{j\omega}+L_1} \right|$$

$$\Delta V_2 = \frac{R_2 C_C}{2} \frac{dV_{GNDh}}{dt} \quad (2)$$

In the equations, k denotes a coupling coefficient (where 0<k<1), $L_1$ denotes transmission coil self-inductance, $L_2$ denotes reception coil self-inductance, $R_1$ denotes transmission coil parasitic resistance, $R_2$ denotes reception coil parasitic resistance, $R_{driver}$ denotes transmitting transistor output resistance, and $C_C$ denotes a capacitance between transmission and reception coils. In addition, mutual inductance M is expressed as $M=k(L_1 \cdot L_2)^{1/2}$.

The Gain in equation (1) represents a percentage convertible as an output signal voltage to be outputted to the receiver circuit among an input signal voltage inputted at the transmitter circuit, and it is desirable that the Gain be great. As shown in equation (1), since the Gain becomes greater as the transmission coil parasitic resistance $R_1$ becomes smaller, it is desirable that the transmission coil parasitic resistance $R_1$ be small.

Using the microtransformer according to the present embodiment enables a reduction in the transmission coil parasitic resistance $R_1$. Accordingly, as shown in equation (1), the Gain can be increased. In other words, the percentage convertible as the output signal voltage among the input signal voltage can be increased.

Capacitive coupling noise $\Delta V_2$ represents a magnitude of reception signal-side voltage that is generated when GND potential varies. Since capacitive coupling noise $\Delta V_2$ may cause transformer communication error, it is desirable that the capacitive coupling noise $\Delta V_2$ be small. As shown in equation (2), since capacitive coupling noise $\Delta V_2$ is proportional to reception coil parasitic resistance $R_2$, it is desirable that the reception coil parasitic resistance $R_2$ be small.

As described above, from the view point of improving properties of the transformer, both transmission coil parasitic resistance $R_1$ and reception coil parasitic resistance $R_2$ are favorably small. According to the present embodiment, even when the second coil that is a low-resistance metal layer coil is used as either one of the transmission coil and the reception coil (e.g., the reception coil), since the first coil to be used as the other coil (e.g., the transmission coil) comprises the trench coil connected in parallel with the semiconductor layer coil, the resistance value of the first coil can also be reduced. By using the first coil comprising a semiconductor layer coil provided on a semiconductor substrate and a trench coil, the microtransformer can be downsized and the resistance of the first coil can be reduced. As a result, downsizing of the microtransformer, and increasing gain while reducing capacitive coupling noise can be simultaneously achieved.

Furthermore, in the present embodiment, a metal-oxide layer making contact with the semiconductor layer coil is further provided. Since the resistance value of the first coil is further reduced by the metal-oxide layer, gain can be further increased or capacitive coupling noise can be further reduced.

Figure 6:
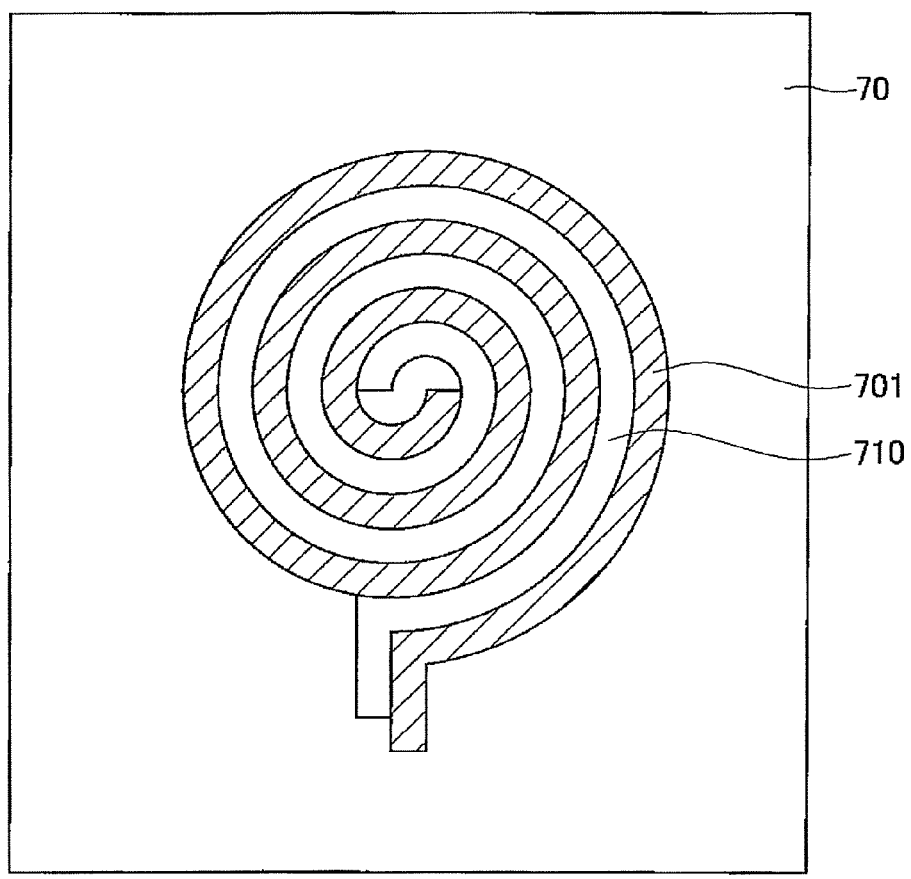
FIG. 6 is a plan view of a first coil of a microtransformer according to a modification.

In the embodiment described above, although the semiconductor layer coil, the trench coil and the metal layer coil are formed in approximately square spiral shapes as illustrated in FIGS. 1 and 2 having their whorls alternately arranged in the radial direction thereof, the shapes are not limited thereto. For example, a circular semiconductor layer coil 701 and a circular trench coil 710 having their whorls alternately arranged in the radial direction thereof may be formed on a surface of a p-type semiconductor layer 70 as in the case of the microtransformer 7 illustrated in FIG. 6. Besides a circular shape, spiral shapes of other polygonal shapes such as a triangle or a hexagon may be adopted. The semiconductor layer coil, the trench coil and the metal layer coil preferably have spiral shapes with multiple whorls.

In addition, although the trench coil penetrates the p-type semiconductor layer in FIG. 3, configurations are not limited thereto. For example, a depth of the trench coil may be set to around half of a depth of the p-type semiconductor layer, and a lower end of the trench coil may not be in contact with an insulating layer laminated on a rear surface-side of the p-type semiconductor layer. Furthermore, while an SOI substrate is used as the material of the microtransformer in the present embodiment, an SOI substrate need not be used.

Moreover, although a first coil comprising a semiconductor coil and a trench coil is connected to a transmitter circuit and a second coil comprising a metal layer coil is connected to a receiver circuit in the embodiment described above, the first coil can be used connected to the receiver circuit and the second coil can be used connected to the transmitter circuit.

Specific embodiments of the present teachings are described above, but these embodiments merely illustrate some representative possibilities for utilizing the present teachings and do not restrict the claims thereof. The subject matter set forth in the claims includes variations and modifications of the specific examples set forth above.

The technical elements disclosed in the specification or the drawings may be utilized separately or in other combinations that are not expressly disclosed herein, but will be readily apparent to a person of ordinary skill in the art. Furthermore, the subject matter disclosed herein may be utilized to simultaneously achieve a plurality of objects or to only achieve one object, which object(s) may not be explicitly recited in the present disclosure.

What is claimed is:

1. A transformer comprising:
   a semiconductor substrate comprising a first conductivity type semiconductor layer;
   a semiconductor layer coil comprising a semiconductor layer coil wiring composed of a second conductivity type semiconductor layer laminated on a surface side of the first conductivity type semiconductor layer;
   a trench coil electrically connected with the semiconductor layer coil in parallel;
   a coil insulating layer laminated on the surface side of the first conductivity type semiconductor layer, covering over both of the semiconductor layer coil and the trench coil; and
   a metal layer coil arranged on a surface of the coil insulating layer,
   wherein a trench is formed in the first conductivity type semiconductor layer,
   each of the semiconductor layer coil wiring and the trench has a spiral shape,
   the trench and the semiconductor layer coil wiring are alternately disposed in the radial direction thereof, the trench coil comprises (a) a trench insulating film arranged on an inner surface of the trench, and (b) a trench coil wiring composed of a conductive layer disposed within the trench and covered by the trench insulating film, and the metal layer coil opposes both of the semiconductor layer coil and the trench coil.

2. The transformer according to claim 1, further comprising:

a metallic compound layer arranged between the semiconductor layer coil and the coil insulating layer, the metallic compound layer making contact with the semiconductor layer coil.

3. The transformer according to claim 2, wherein the metallic compound layer is composed of a silicide layer.

4. An apparatus comprising:

a first coil;

a second coil magnetically connected to the first coil;

a transmitter circuit electrically connected to one of the first and second coils; and a receiver circuit electrically connected to another of the first and second coils, wherein the first coil comprises a semiconductor layer coil and a trench coil electrically connected with the semiconductor layer coil in parallel, the semiconductor layer coil comprises a semiconductor layer coil wiring composed of a semiconductor layer, the trench coil comprises a trench coil wiring composed of a conductive layer and a trench insulating film covering the trench coil wiring, each of the semiconductor layer coil wiring and the trench coil wiring has a spiral shape, the trench coil wiring and the semiconductor layer coil wiring are alternately disposed in a radial direction thereof, and the second coil comprises a metal layer coil opposing both of the semiconductor layer coil and the trench coil.

5. The apparatus according to claim 4, wherein the semiconductor layer coil further comprises a metallic compound layer arranged on the semiconductor layer coil wiring, and the metallic compound layer makes contact with the semiconductor layer coil wiring.

6. The apparatus according to claim 5, wherein the metallic compound layer is composed of a silicide layer.

7. The apparatus according to claim 4, further comprising a coil insulating layer disposed between the first coil and the second coil, wherein the first coil is insulated from the second coil by the coil insulating layer.

8. The apparatus according to claim 4, wherein the transmitter circuit is electrically connected to the first coil, and the receiver circuit is electrically connected to the second coil.

9. The apparatus according to claim 4, wherein the transmitter circuit is electrically connected to the second coil, and the receiver circuit is electrically connected to the first coil.

* * * * *